United States Patent
Muramatsu

(10) Patent No.: US 6,872,992 B2
(45) Date of Patent: Mar. 29, 2005

(54) SEMICONDUCTOR DEVICE FOR DETECTING WIDE WAVELENGTH RANGES

(75) Inventor: Masaharu Muramatsu, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 09/974,817

(22) Filed: Oct. 12, 2001

(65) Prior Publication Data

US 2002/0020859 A1 Feb. 21, 2002

Related U.S. Application Data

(63) Continuation-in-part of application No. PCT/JP00/02424, filed on Apr. 13, 2000.

(30) Foreign Application Priority Data

Apr. 13, 1999 (JP) .......................................... P11-105442

(51) Int. Cl.⁷ ...................... H01L 27/148; H01L 29/768
(52) U.S. Cl. ......................... 257/228; 257/447; 257/460
(58) Field of Search ................................ 257/447, 460, 257/222–231, 239, 432, 433, 294, 291–293, 443, 80, 440, 452, 82, 723, 724; 438/69, 57, 71, 73

(56) References Cited

U.S. PATENT DOCUMENTS

| | | | | |
|---|---|---|---|---|
| 4,422,091 A | * | 12/1983 | Liu | 357/24 |
| 4,656,519 A | * | 4/1987 | Savoye | 358/213 |
| 4,912,545 A | * | 3/1990 | Go | 357/67 |
| 5,070,380 A | * | 12/1991 | Erhardt et al. | 357/24 |
| 5,134,274 A | * | 7/1992 | Poole et al. | 250/208.1 |
| 5,227,313 A | * | 7/1993 | Gluck et al. | 437/2 |
| 5,512,750 A | * | 4/1996 | Yanka et al. | 250/338.4 |
| 5,652,150 A | * | 7/1997 | Wadsworth et al. | 437/2 |
| 5,808,329 A | * | 9/1998 | Jack et al. | 257/188 |
| 5,808,350 A | * | 9/1998 | Jack et al. | 257/440 |
| 5,904,495 A | * | 5/1999 | Burke et al. | 438/98 |
| 2001/0028401 A1 | * | 10/2001 | Miyashita | 348/296 |
| 2002/0017611 A1 | * | 2/2002 | Tashiro | 250/370 |

FOREIGN PATENT DOCUMENTS

| | | | |
|---|---|---|---|
| EP | 0 820 104 A | 1/1998 | |
| JP | 2-22973 | 1/1990 | |
| JP | 2-23782 | 1/1990 | |
| JP | 02-022973 | * 1/1990 | ............ H04N/5/33 |
| JP | 2-147826 | 6/1990 | |
| JP | 5-133796 | 5/1993 | |
| JP | 06045574 | 2/1994 | |
| JP | 09-304182 | * 11/1997 | |
| JP | 9-304182 | 11/1997 | |
| JP | 10-256613 | 9/1998 | |
| WO | WO 98/57376 | 12/1998 | |

* cited by examiner

*Primary Examiner*—Mary Wilczewski
*Assistant Examiner*—Monica Lewis
(74) *Attorney, Agent, or Firm*—Morgan, Lewis & Bockius LLP

(57) ABSTRACT

A CCD unit is provided on the surface side of a thin shape section that is formed on a first substrate. In the CCD unit, first cells are provided and disposed in the form of an array in a direction in which the thin shape section extends. An InGaAs photodiode unit is provided at a second substrate in the InGaAs photodiode unit, second cells are provided and disposed in an array in the same direction as the first cells while having equal pitches to the first cells. The first substrate and second substrate are stacked over each other in such a manner that the surface of the first substrate and a second incidence plane of the second substrate oppose each other to ensure that part of a first photoelectric conversion region of the CCD unit correspondingly overlap part of a second photoelectric conversion region of the InGaAs photodiode unit when seen in plan view.

7 Claims, 10 Drawing Sheets

SEMICONDUCTOR DEVICE FOR DETECTING WIDE WAVELENGTH RANGES

RELATED APPLICATION

This is a continuation-in-part application of application Ser. No. PCT/JP00/02424 filed on Apr. 13, 2000, now pending.

BACKGROUND OF THE INVENTION

1. Field of the Invention

The present invention relates to semiconductor devices comprising image sensing or pickup elements.

2. Related Background Art

Optical detection of wide wavelength ranges is widely performed in a variety of systems including, but not limited to, spectrum analyzers and/or material analysis/contaminant detection apparatus based on absorption of light in specified wavelength bands.

For example, a semiconductor device with two-stage structure is shown in Japanese Patent Laid-Open No. 304182/1997. FIG. 10 is a diagram showing a system configuration of such prior art device, which is adaptable for detection of the color shades of rice grains that have been passed through each channel 105. While the target body being detected is denoted by reference numeral 127, an image of this target body 127 is focused by a condensing lens 119 to fall onto a semiconductor device consisting essentially of semiconductor image sensing or pickup elements 122A, 123A of the two-stage structure. More specifically, the above-identified Japanese document discloses therein the two-stage structure semiconductor device which includes a first photodetector (Si photodiode) 122A having high sensitivity in a visible light range and a second photodetector (InGaAs array sensor) 123A, wherein these elements are stacked or laminated over each other.

SUMMARY OF THE INVENTION

In the two-stage structure semiconductor device stated above, combining two image pickup elements using different semiconductor materials makes it possible to detect light rays of different wavelength ranges. However, in the above-stated semiconductor device, it is merely possible to focus the target body image on only one of the first and second image sensors, which in turn makes it impossible to successfully perform any intended image pickup operation. The present invention has been made in view of the point stated above, and its primary object is to provide a semiconductor device capable of successfully performing an image sensing or pickup operation even in cases where a couple of image sensing elements using different semiconductor materials are employed in combination.

The present invention is featured in that a first semiconductor image sensing or pickup element of the back-illuminated type is laid out at a second semiconductor image pickup element made of a semiconductor material different from that of the first semiconductor image pickup element in such a manner that respective photosensitive regions (light absorption layers) of the first and second semiconductor image pickup elements are located in close proximity to each other. Since the back-illuminated semiconductor image pickup element is such that its photosensitive region is placed on the opposite side to a light incidence plane, letting the first and second semiconductor image pickup elements be stacked or laminated over each other makes it possible to permit the photosensitive regions of respective semiconductor image pickup elements to come closer in position to each other, thus causing the focus position of an image of a target body being sensed to become adjacent thereto, which in turn enables execution of successful image pickup operations while at the same time suppressing or minimizing any possible image defocusing or blooming defects.

DESCRIPTION OF THE PREFERRED EMBODIMENT

Figure 1:
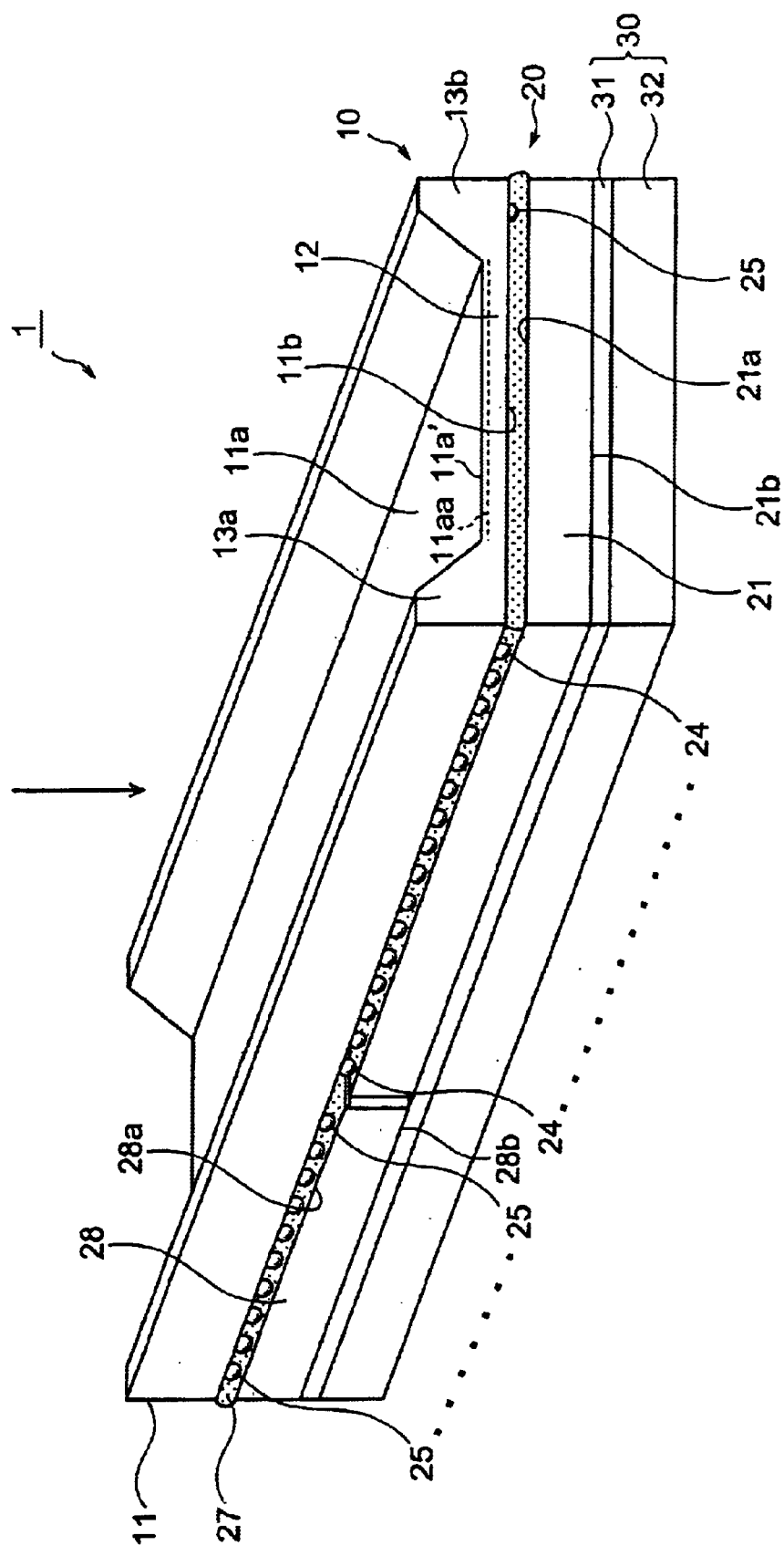
FIG. 1 is a diagram showing a perspective outer appearance view of a first embodiment of the semiconductor device in accordance with the present invention.

Preferred forms of the present invention will now be set forth on the basis of the accompanying drawings. Note here that in explanation of the drawings, the same elements are designated by the same reference characters, and any duplicative explanation will be eliminated.

(First Embodiment)

Figure 2:
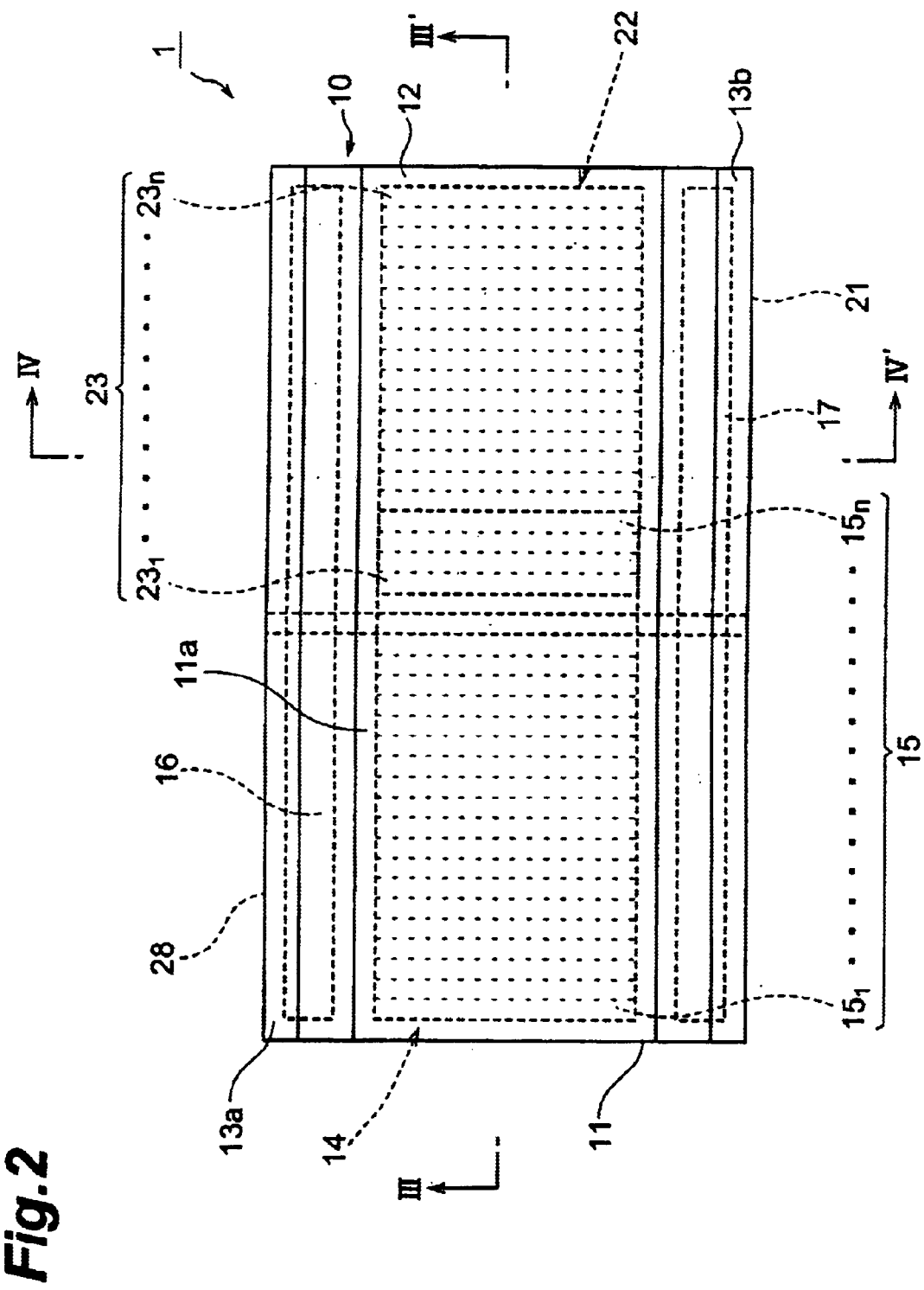
FIG. 2 is a top plan view diagram showing the first embodiment of the semiconductor device in accordance with this invention.
Figure 3:
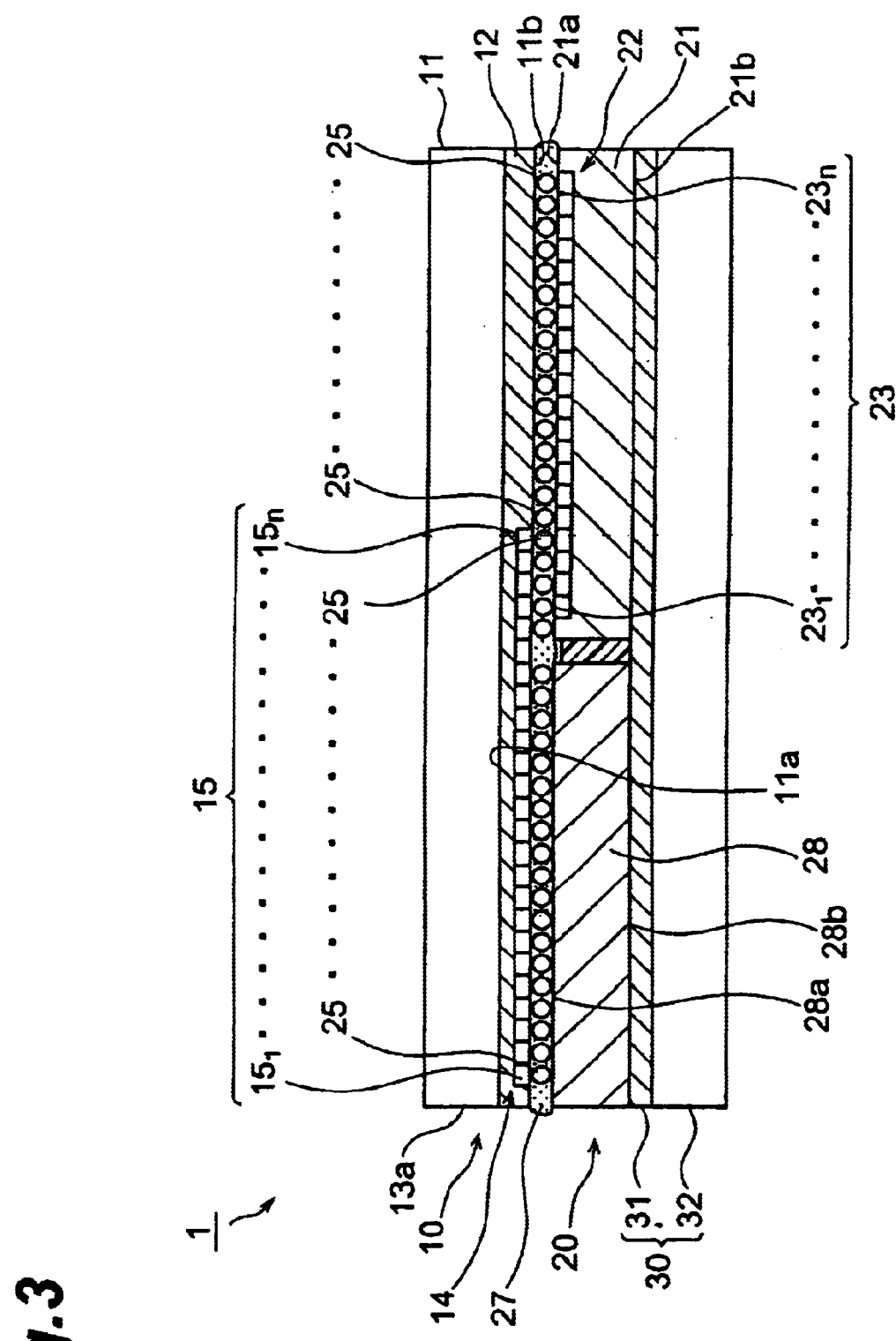
FIG. 3 is a sectional view as taken along line III–III' of FIG. 2.
Figure 4:
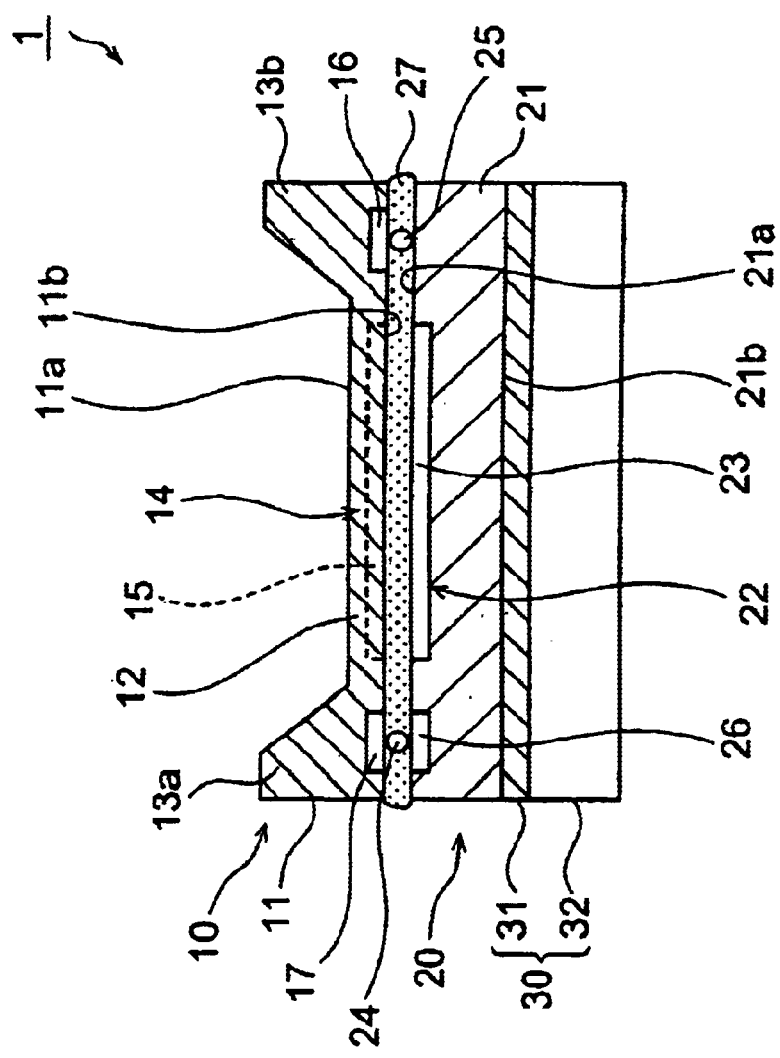
FIG. 4 is a sectional view along line IV–IV' of FIG. 2.

FIG. 1 is a diagram showing a perspective outer appearance view of a semiconductor device in accordance with a first embodiment of the invention; FIG. 2 is a top plan view of the semiconductor device; FIG. 3 is a sectional view of the semiconductor device as cut along line III–III' of FIG. 2; and, FIG. 4 is a sectional view of the semiconductor device as cut along line IV–IV' of FIG. 2. In the first embodiment, there is shown an example wherein the semiconductor device is applied to a measurement apparatus (spectrum analyzer) for measuring an intensity distribution as a function of the wavelength in a specified direction.

The semiconductor device of the illustrative embodiment is featured in that a first back-illuminated semiconductor image sensing or pickup element 10 is disposed so that it is stacked or laminated over a second semiconductor image pickup element 20 made of a chosen semiconductor material different from that of the first semiconductor image pickup element 10 in such a manner that respective photosensitive regions (light absorption layers) 15, 22 of the first and second first semiconductor image pickup elements 10, 20 are placed in close proximity to each other. Since the back-illuminated semiconductor image pickup element is such that its photosensitive region is placed on the opposite side to the light incident plane thereof, laminating the first and second semiconductor image pickup elements over each other makes it possible to permit the photosensitive regions of respective semiconductor image pickup elements to come closer to each other, thus causing the focusing position of an image of a target body being detected to become adjacent, which may in turn enable effectuation of successful image pickup operations while at the same time suppressing or minimizing any possible image defocusing or blooming defects. Optionally the image pickup elements 10, 20 may be formed of one-dimensional or two-dimensional image sensors. A detailed explanation will be given below.

The semiconductor device 1 is mainly constituted from a first photodetector (first semiconductor image pickup element) 10, a second photodetector (second semiconductor image pickup element) 20, and a cooler 30. The semiconductor device 1 is specifically provided and arranged so that certain light which has been subjected to spectrum analysis by use of a spectrum means (not depicted) that includes a spectroscope or prism or else and has a wavelength distribution in a specified direction (first substrate 11's long axis direction when seen in top plan view) falls (enters from a direction indicated by arrow in FIG. 1) onto the first photodetector (first semiconductor image pickup element) 10 via a single optical system (not shown) including a focusing lens or the like.

The first photodetector 10 has a first substrate 11 of almost rectangular shape when seen in plan view, wherein this first substrate 11 is structured from a P-type Si substrate. In the first substrate 11 a thin shape section 12 extending in the plan-viewed long axis direction is formed at a central position in the plan-viewed short axis direction of the first substrate 11. The thin shape section 12 has a thickness that is set at approximately 10 to 30 $\mu$m. Edge portions 13$a$, 13$b$ that are placed on the both sides of the thin shape section 12 are designed so that each has a thickness of about 300 $\mu$m in order to attain the intended mechanical strength of the first substrate 11. A surface 11$b$ of the first substrate 11 with respect to a first incidence plane 11$a$ is formed into an almost planar shape. Note that the optical detection function operates even in the absence of the edge portions 13$a$, 13$b$.

A Si oxide film 11$a'$ for use as a protective film is formed on the first light incidence plane (let it be a back face) of the first substrate 11 to have a thickness of about 0.1 $\mu$m whereas a P$^+$ high concentration layer for use as an accumulation layer 11$aa$ (forming a potential slope) is formed at part on the first incidence plane 11$a$ side of the thin shape section 12. The P$^+$ high concentration layer is formed to have a thickness of about 0.2 $\mu$m by way of example and also have a function of causing electrical charge carriers as created through photoelectric conversion at part adjacent to the first incidence plane 11$a$ to readily diffuse into a potential well(s) for charge transfer. The Si (first semiconductor) at the thin shape section (photosensitive region: light absorption layer) 12 which makes up a first photoelectric conversion unit has absorption characteristics (sensitivity) within a wavelength range of from 0.12 to 1.1 $\mu$m. The thin shape section 12 may be formed through etching of a P-type substrate with a thickness of about 300 $\mu$m from the first incidence plane 11$a$ side at a depth of 270 to 290 $\mu$m (the edge portions 13$a$, 13$b$ are remained due to inhibition of such etching), although not specifically limited thereto.

Figure 5:
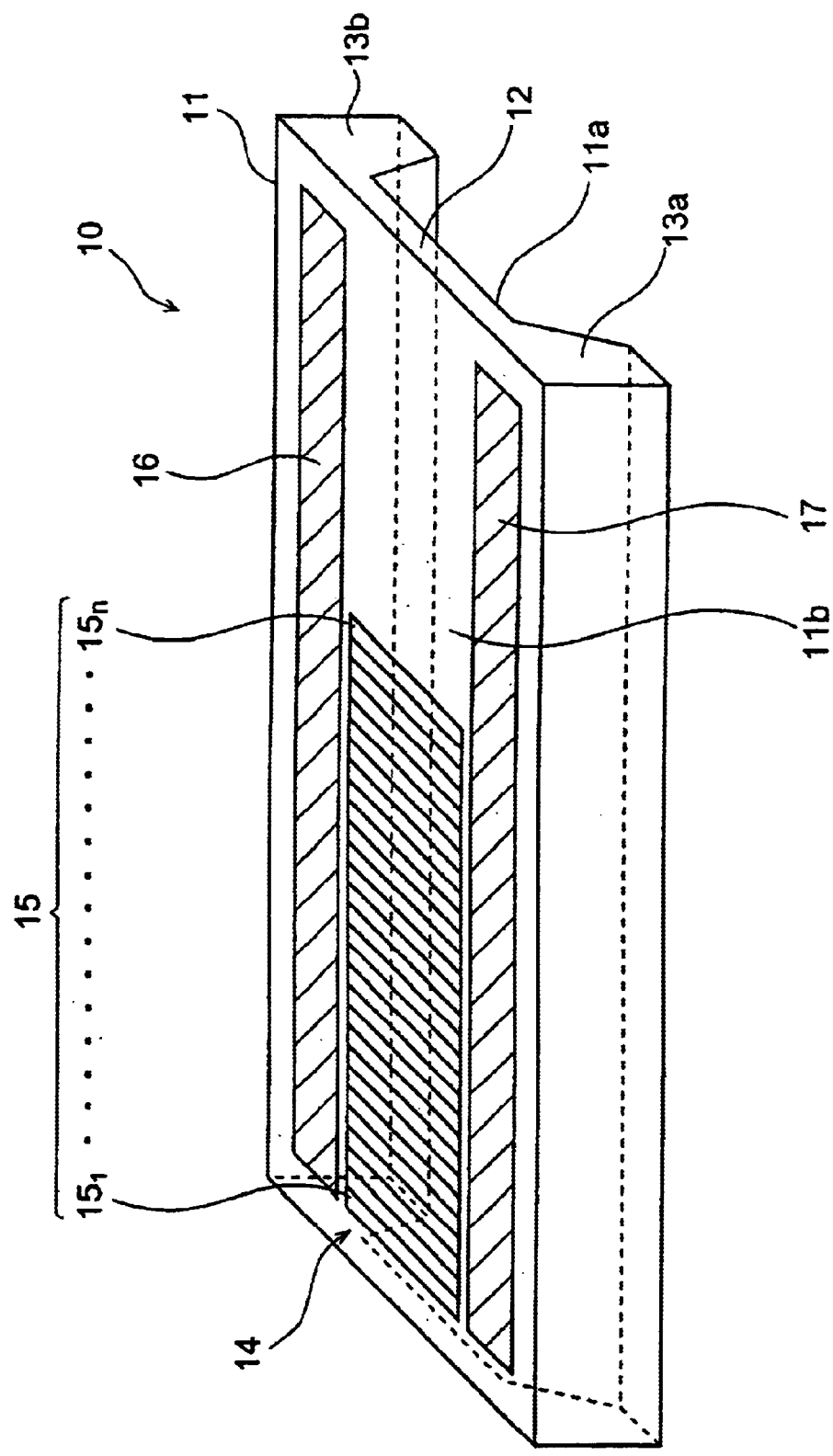
FIG. 5 is a perspective outer appearance view of a first substrate that is included in the first embodiment of the semiconductor device in accordance with the invention.

As also shown in FIG. 5, a CCD unit 14 which includes charge transfer electrodes and semiconductor material placed at the deep part thereof is formed at part on the side of the surface 11$b$ opposing the first incidence plane 11$a$ of the thin shape section 12: in this CCD unit 14, first cells 15$_{1-n}$ that constitute a first charge readout section are provided and disposed to have an array shape in a direction (plan-viewed long axis direction of first substrate 11) of extension of the thin shape section 12 from one end portion nearby position in the plan-viewed long axis direction of the first substrate 11—for example, 256 columns are provided. The remaining end portion side in the plan-viewed long axis direction of first substrate 11 is designed as a non-formation region of the CCD unit 14. Also provided in the CCD unit 14 are a first shift register 16 for use as a first charge transfer section and a second shift register 17 serving as a second charge transfer section, with the first cells 15$_{1-n}$ being laid between the registers. The first shift register 16 is arranged to sequentially scan respective first cells 15$_{1-n}$ and to transfer charge carriers as read out of the first cells 15$_{1-n}$ and then output a signal corresponding to this charge from an electrode section (not shown) as an output signal.

Figure 6:
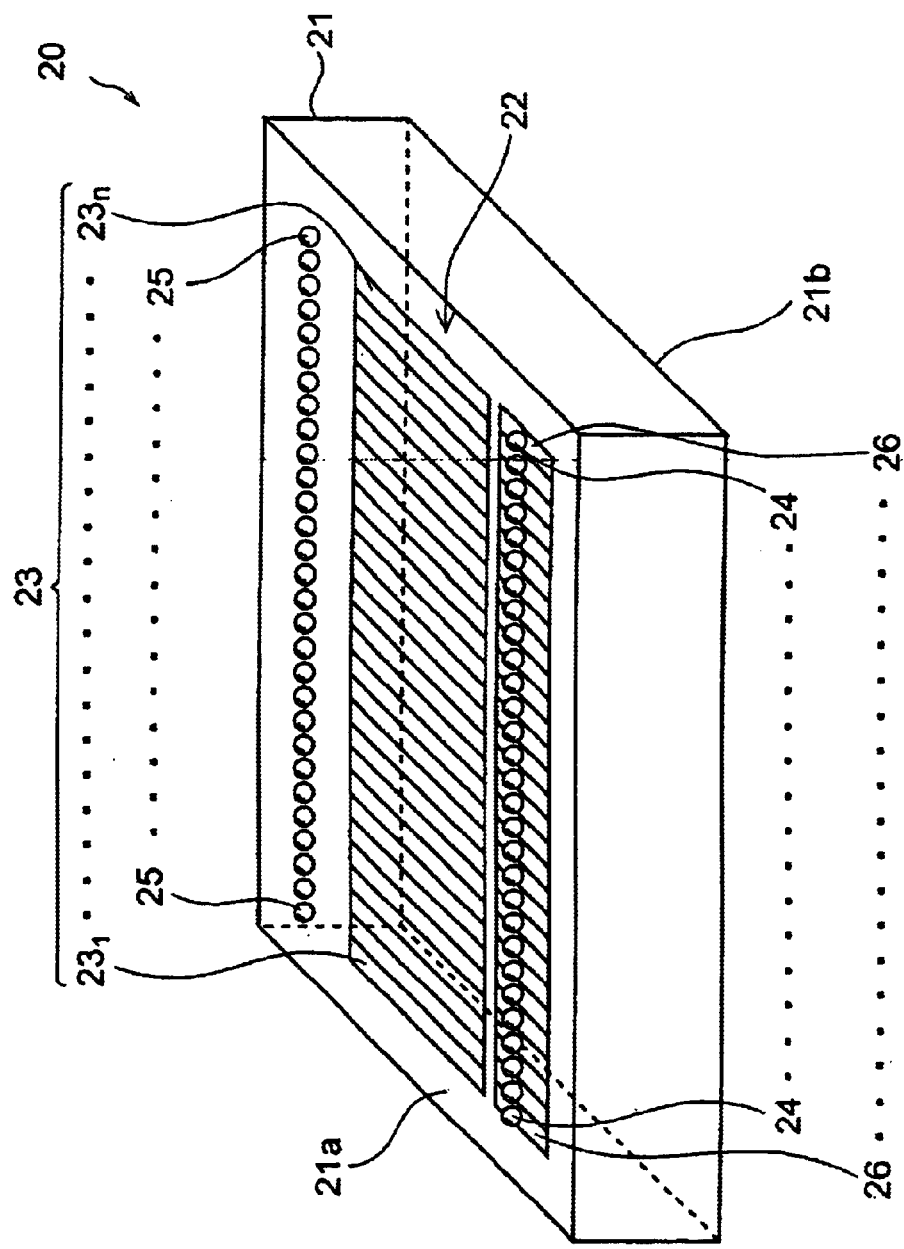
FIG. 6 is a perspective outer appearance view of a second substrate as included in the first embodiment of the semiconductor device in accordance with the invention.

The second photodetector 20 has a second substrate 21 that is formed into almost rectangular body shape, wherein a length of the second substrate 21 in the plan-viewed long axis direction is designed to be shorter than the length of first substrate 11 in plan-viewed long axis direction. As shown in FIG. 6 also, an InGaAs photodiode unit 22 is formed on the side of a second incidence plane 21$a$ of the second substrate 21: in this InGaAs photodiode unit 22, second cells 23$_{1-n}$ constituting a second photoelectric conversion section and second charge read section are laid out with equal pitches to the first cells 15$_{1-n}$ to have an array shape in the plan-viewed long axis direction of the second substrate 21—for example, in 256 columns. InGaAs (second semiconductor) making up the second photoelectric conversion section has absorption characteristics (sensitivity) within a wavelength range of 0.7 to 1.7 $\mu$m, which is shifted to the long wavelength side as compared to the 0.12–1.1 $\mu$m range of the absorption characteristics (sensitivity) of Si (first semiconductor). In more detail, the InGaAs (second semiconductor) is required to have a forbidden band gap smaller than the forbidden band gap (1.21 eV) of Si (first semiconductor) in such a way as to achieve the long wavelength side shift than the 0.12–1.1 $\mu$m range of the absorption characteristics (sensitivity) of Si (first semiconductor) To let the forbidden band gap of InGaAs (second semiconductor) be less than the forbidden band gap of Si (first semiconductor), it is required to adjust the ratio of In to Ga: in In$_{1-x}$Ga$x$As, let "x" be set at 0<x<0.86.

As shown in FIG. 2 or FIG. 3, the first substrate 11 and second substrate 21 are stacked over each other in such a manner that the surface 11$b$ of first substrate 11 (thin shape section 12) and the second incidence plane 21$a$ of second substrate 21 oppose each other in the state that the second substrate 21 is placed on the other edge side (non-formation region side of the CCD unit 14) to ensure that part of the first photoelectric conversion region 15 of the CCD unit 14 correspondingly overlaps part of the second photoelectric conversion region 23 of InGaAs photodiode unit 22 when seen in plan view. Bumps 24, 25 of about 50 $\mu$m height are provided between the first substrate 11 and the second substrate 21, wherein the surface 11$b$ of first substrate 11 (thin shape section 12) and the second incidence plane 21$a$ of second substrate 21 are disposed in close proximity to each other in the state that a distance between the surface (face opposing the second substrate) of the first substrate 11 (thin shape section 12) and the second light incidence plane 21$a$ of second substrate 21 is controlled to measure about 50 $\mu$m. Note here that such connection with the bumps 24, 25 laid therebetween is called "bump-bonding." The bumps 24, 25 function also as position alignment markers for causing part of the first photoelectric conversion region 15 of CCD unit 14 to correspondingly overlap part of the second photoelectric conversion region 23 of the InGaAs photodiode unit 22 when laminating the first substrate 11 and second substrate 21 over each other.

The bumps 24 are those bumps (more than at least three) having electrical conductivity, and the second cells 23 are connected to the second shift register 17 through the bumps 24 and electrode pads 26 as electrically connected to the second cells 23$_{1-n}$. The second shift register 17 is designed to sequentially scan respective second cells 23 and then transfer charges read out of the second cells $23_{1-n}$ to thereby output a signal corresponding to this charge packet from an electrode section (not shown) as an output signal. More specifically the first semiconductor image pickup element 10 comprises the shift register 17 that is formed on the first semiconductor image pickup element 10, wherein the shift register 17 is electrically connected via the bumps 24 to the second semiconductor image pickup element 20, and driving the shift register 17 permits reading of a signal from the second semiconductor image pickup element 20.

It is not necessarily required to use conductive bumps (dummy bumps) as the bumps 25. In the case of using conductive bumps, it will be required to use a specific arrangement for preventing the second substrate 21 side and the first substrate 11 side from being electrically connected together via the bumps, such as a technique for eliminating any electrode pads with respect to these bumps or alternatively a technique for connecting no wire leads to certain electrode pads which correspond to the bumps.

A resin material 27 that is optically transparent relative to the wavelength range of 0.7 to 1.7 μm which is the absorption characteristics (sensitivity) range of InGaAs, such as for example silicone resin, is filled and hardened between the first substrate 11 and the second substrate 21.

In a space defined by the first substrate 11 and second substrate 21, a third substrate 28 is provided which is formed into almost rectangular solid body shape. The third substrate 28 is such that the surface 11b of the first substrate 11 (thin shape section 12) and the third substrate 28 are stacked to oppose each other in the state that it is positioned on the lateral side of the second substrate 21 and on one edge side of the first substrate 11 (on the formation region side of CCD unit 14). The third substrate 28 has its thermal conductivity and height equal to those of the second substrate 21. The first substrate 11 and third substrate 28 are bump-bonded in a way similar to that in the case of the second substrate 21, wherein bumps 25 of about 50 μm high are provided between the first substrate 11 and third substrate 28. Accordingly the surface 11b of the first substrate 11 (thin shape section 12) and a surface 28a of the third substrate 28 are provided and disposed so that these are adjacent to each other in the state that the use of the bumps 25 permits a distance between the surface 11b of first substrate 11 (thin shape section 12) and the surface 28a of third substrate 28 is controlled to measure about 50 μm. The third substrate 28 can be formed of second semiconductor. More specifically the first and second semiconductor image pickup elements 10, 20 are such that only part thereof overlaps while causing a specific substrate (third substrate 28) containing the same material as the second semiconductor image pickup element 20 to be in contact with a region in the first semiconductor image pickup element 10, which region does not overlap the second semiconductor image pickup element 20.

With respect to the surfaces 21a, 28a of the second substrate 21 and third substrate 28 which oppose the first substrate 11, the surface 21a, 28b sides are formed into almost planar shape, with the cooler 30 being contacted with the back surface thereof. The cooler 30 has a thermoelectric cooling (Peltier) element 32 and a plate 31 that is made of Al or the like excellent in thermal conductivity and is in contact with the second substrate 21 and third substrate 28, wherein a heat absorption section of the Peltier element 32 is provided so that it is in contact with the plate 31 excellent in thermal conductivity. A heat generation section of the Peltier element 32 being positioned on the opposite side to the heat absorption section is connected to a power supply unit (not shown) for supplying electrical power to the Peltier element 32.

According to the semiconductor device 1 arranged as stated above, incident light of the wavelength are of 0.12 to 1.1 μm within the absorption characteristics range of Si (first semiconductor) of the first photodetector 10 is absorbed by Si (first semiconductor) and then converted into a packet of charge carriers. The resultant charge packet as has been converted within the Si (first semiconductor) is read out of the first cells $15_{1-n}$ at the CCD unit 14 and is then transferred by the first shift register 16 to be output from the electrode section (not shown) as an output signal. When incident light to the semiconductor device 1 is absorbed by the Si (first semiconductor) and then converted to charge packet, it is possible by formation of the thin shape section 12 in the first substrate 11 (P-type Si substrate) to prevent those electrons created through photoelectric conversion at nearby portions to the first incidence plane 11a from disappearing due to recombination before diffusion into a potential well (s) as formed by the CCD unit 14 (respective first cells $15_{1-n}$) while at the same time shortening the distance between the first incidence plane 11a of thin shape section 12 used for photoelectric conversion and the CCD unit 14 (respective first cells $15_{1-n}$) to thereby reduce diffusion toward neighboring cells thus precluding reduction of the resultant resolution.

The incident light to the semiconductor device 1 which are on the long wavelength side beyond the absorption characteristics range of Si (first semiconductor) are not absorbed by Si (first semiconductor) and thus behave to reach the InGaAs photodiode unit 22 (second cells $23_{1-n}$). The light reached the InGaAs photodiode unit 22 (second cells 23) is then absorbed by InGaAs (second semiconductor) for conversion into charge carriers. The resulting charge packet as converted within the InGaAs (second semiconductor) will be read out of the InGaAs photodiode unit 22 (second cells $23_{1-n}$) and then transferred by the second shift register 17 to be output from the electrode section (not depicted) as an output signal.

Light of near infrared range of the wavelength 0.7 to 1.1 μm is such that because Si used as the first semiconductor exhibits absorption characteristics (sensitivity) up to light of a wavelength of about 1.1 μm, light which should be inherently expected to reach the InGaAs photodiode unit 22 (second cells $23_{1-n}$) is absorbed by Si and thus becomes impossible to arrive at the InGaAs photodiode unit 22 (second cells $23_{1-n}$). Whereby, with the semiconductor device 1 of the structure with the first substrate 11 and second substrate 21 stacked over each other, there is also contained a problem that the resulting sensitivity extremely decreases at the second photoelectric conversion region 23 of the InGaAs photodiode unit 22 normally having absorption characteristics (sensitivity) in the wavelength range of 0.7 to 1.7 μm, which region is placed at a position for detection of near infrared range of 0.7–1.1 μm. However, because the thin shape section 12 is formed in the first substrate 11 (P-type Si substrate) while providing the InGaAs photodiode unit 22 (second cells $23_{1-n}$) that opposes this thin shape section 12, the light of near infrared range of 0.7–1.1 μm is no longer partly absorbed by Si, and thus reaches the InGaAs photodiode unit 22 (second cells $23_{1-n}$). Whereby, it becomes possible to detect the light with wavelength range of 0.7–1.1 μm at the InGaAs photodiode unit 22 (second cells $23_{1-n}$).

In addition, since the thin shape section 12 is formed while causing the first substrate 11 and second substrate 21 to be stacked over each other with the surface 11b of the first substrate 11 (thin shape section 12) and the second incidence plane 21a of second substrate 21 adjacently opposing each other when seen in plan view, the thin shape section 12 and the second photoelectric conversion region 23 are set in the state that these are adjacent to each other. Whereby, even in the case of employing a single optical system, it is possible by setting a focusing position of such optical system at specific location substantially midway between the surface 11b (face opposing the second substrate 21) with respect to the first incidence plane 11a of the thin shape section 12 and the second incidence plane 21a of second substrate 21 (second photoelectric conversion region 23) to substantially focus incident light onto the semiconductor device 1 even with respect to either one of the thin shape section 12 the and second photoelectric conversion region 23, which in turn makes it possible to suppress reduction of the sensitivity at the first photodetector 10 and the second photodetector 20. Additionally, even in cases where the focusing position of the optical system is offset from the substantially midway position between the surface 11b (face opposing the second substrate 21) with respect to the first incidence plane 11a of thin shape section 12 and the second incidence plane 21a of second substrate 21 (second photoelectric conversion region 23), any possible decrease in the sensitivity at either the first photodetector 10 or the second photodetector 20 due to the above-noted positional deviation or "offset" will be suppressed because of the fact that the thin shape section 12 and the second photoelectric conversion region 23 are in the state that they are adjacent to each other.

In addition, since the resin material 27 such as for example silicone resin which is optically transparent relative to the wavelength range of 0.7 to 1.7 µm that is the absorption characteristics (sensitivity) range of InGaAs is filled and hardened between the first substrate 11 and the second substrate 21, the first substrate 11 and second substrate 21 are connected by the resin 27, thus making it possible to increase the mechanical strength of the thin shape section 12 of first substrate 11 in particular. Additionally, as the resin 27 is optically transparent relative to the 0.7–1.7 µm wavelength range which is the absorption characteristics (sensitivity) range of InGaAs, it is possible to suppress or preclude it from affecting the sensitivity at the second photodetector 20 (InGaAs photodiode unit 22).

In addition, since the first substrate 11 and the second substrate 21 are arranged so that the surface 11b of first substrate 11 (thin shape section 12) and the second incidence plane 21a of second substrate 21 are disposed to adjacently oppose each other when seen in plan view in the state that the second substrate 21 is placed on the other edge side (non-formation region side of CCD unit 14) of the first substrate 11 to ensure that part of the first photoelectric conversion region 15 of the CCD unit 14 correspondingly overlaps part of the second photoelectric conversion region 23 of the InGaAs photodiode unit 22, it becomes possible to miniaturize or "downsize" the semiconductor device 1. Additionally, as part of the first photoelectric conversion region 15 of CCD unit 14 is provided so that it correspondingly overlaps part of the second photoelectric conversion region 23 of the InGaAs photodiode unit 22, it becomes possible to obtain continued intensity distribution information of light incident to the semiconductor device 1.

In addition, although the reliability of an output signal based on charge carriers read at certain second cells $23_{1-n}$ that are positioned at edge portions decreases due to the fact that those second cells $23_{1-n}$ of the second cells $23_{1-n}$ as disposed into an array shape which are placed at the edge portions become greater in dark current when compared to the remaining ones, since part of the first photoelectric conversion region 15 of the CCD unit 14 is provided in such a manner as to correspondingly overlap part of the second photoelectric conversion region 23 of the InGaAs photodiode unit 22, it is possible to perform signal processing for interpolation of an output signal from the second photoelectric conversion region 23 with an output signal from the first photoelectric conversion region 15 at such overlapped part, which in turn makes it possible to enhance the reliability of such output signal as the entirety of the semiconductor device 1. Note here that it is also possible to perform signal processing for interpolation of the output signal from the first photoelectric conversion region 15 with the output signal from the second photoelectric conversion region 23 at the overlapped part, and that in regard to the interpolation, a variety of different schemes may also be taken including but no limited to a technique for alternatively selecting one of the output signals or a technique for amending one output signal on the basis of the other output signal.

In addition, since the CCD unit 14 is provided with the first shift register 16 for use as the first charge transfer section and the second shift register 17 serving as the second charge transfer section with the first photoelectric conversion region 15 being sandwiched therebetween, in case one output signal is interpolated with the other output signal at the portion whereat part of the first photoelectric conversion region 15 of CCD unit 14 is correspondingly stacked over part of the second photoelectric conversion region 23 of InGaAs photodiode unit 22, each will be independently transferred by either the first shift register 16 or the second shift register 17 to thereby enable obtainment of the intended output signals from the first shift register 16 and second shift register 17 in a parallel way; thus, it becomes possible to attain rapid interpolation with a simplified arrangement.

In addition, as the first shift register 16 and second shift register 17 are provided in the CCD unit 14 of first substrate 11, it is no longer necessary to provide any shift registers in the second substrate 21, which makes it possible to downsize the semiconductor device 1.

In addition, since the first shift register 16 and the second shift register 17 are provided with the first cells $15_{1-n}$ laid therebetween while letting the second cells 23 be connected to the second shift register 17 via the bumps 24 and electrode pads 26 as electrically connected to the second cells $23_{1-n}$, it is not necessary to provide any shift registers on the second substrate 21, thereby enabling miniaturization or downsizing of the semiconductor device 1. Additionally, since the first substrate 11 and the second substrate 21 are connected (bump-bonded) together with the bumps 24, 25 intervening therebetween, it is possible to reliably control a distance between the surface 11b of first substrate 11 (thin shape section 12) and the second incidence plane 21a of second substrate 21 (to fall within a range of 10 to 80 µm, preferably about 50 µm in this embodiment) while also making it possible to suppress creation of deviation in the sensitivities of the first photodetector and second photodetector 20 due to a change in distance between the surface 11b of first substrate 11 (thin shape section 12) and the second incidence plane 21a of second substrate 21.

In addition, as the back surface 21b side with respect to the surface (second incidence plane) 21a of the second substrate 21 which opposes the first substrate 11 is formed to have an almost planar shape with the cooler 30 being attached to and contacted with this back surface 21b, it becomes possible to improve the cooling efficiency of the second substrate 21. Owing to the cooling of the second substrate 21 by the cooler 30, it is possible to suppress generation of dark currents at the InGaAs photodiode unit 22 (second cells $23_{1-n}$) especially in the case of usage in room temperature conditions. Since the second cells $23_{1-n}$ are connected to the second shift register 17 via the bumps 24 and electrode pads 26 as electrically connected to the second cells 23, it is possible to form the back surface of the second substrate 21 into almost planar shape without suffering from any limitations from the others.

In addition, since the length of the second substrate 21 in its plan-viewed long axis direction is set to be shorter than the length of first substrate 11 in the plan-viewed long axis direction, it is possible to eliminate any unnecessary substrate portions at which the InGaAs photodiode unit 22

(second cells $23_{1-n}$) is not formed, thereby making it possible to reduce production costs of the semiconductor device 1.

In addition, the length of the second substrate 21 in its plan-viewed long axis direction is set so that it is shorter than the length of first substrate 11 in the plan-viewed long axis direction while providing in the space formed by the first substrate 11 and second substrate 21 the third substrate 28 having thermal conductivity substantially equal to that of the second substrate 21 and being formed to have an almost rectangular solid body shape with the back surface 21b, 28b sides being formed into almost planar shape with respect to the surfaces 21a, 28a of the second substrate 21 and third substrate 28 opposing the first substrate 11 and also with the cooler 30 being in contact with this back surface. In case the length of the second substrate 21 in a specified direction is so set as to be shorter than the length of first substrate 11 in the specified direction, since a portion to which heat to the cooler 30 is transmitted through the second substrate 21 and a portion to which no heat is transmitted (whereat the second substrate 21 does not exist) are present in the first substrate 11, resultant temperatures within the first substrate 11 become irregular or non-uniform leading to the possibility of giving bad influences to the detection accuracy at the CCD unit 14 and also to transfer rates at the first shift register 16 and second shift register 17. According to the arrangement stated supra, since the third substrate 28 intervenes between the cooler 30 and the first substrate 11, although the portion to which heat to the cooler 30 is transmitted via the second substrate 21 and the portion to which heat to the cooler 30 is transmitted via the third substrate 28 are present in the first substrate 11, as the third substrate 28 has its thermal conductivity substantially identical to that of the second substrate 21, temperatures inside of the first substrate 11 become essentially uniform thus making it possible to suppress bad influence to the detection accuracy at the CCD unit 14 and the transfer rates at the first shift register 16 and second shift register 17.

It should be noted that as a modified example of the first embodiment, it may be arranged so that a wiring lead pattern is formed on the side of the surface 28a of third substrate 28 which opposes the first substrate 11 while letting this lead pattern be electrically connected to the first shift register 16 and second shift register 17 to thereby permit a signal to be output from the third substrate 28 toward the outside.

(Second Embodiment)

Figure 7:
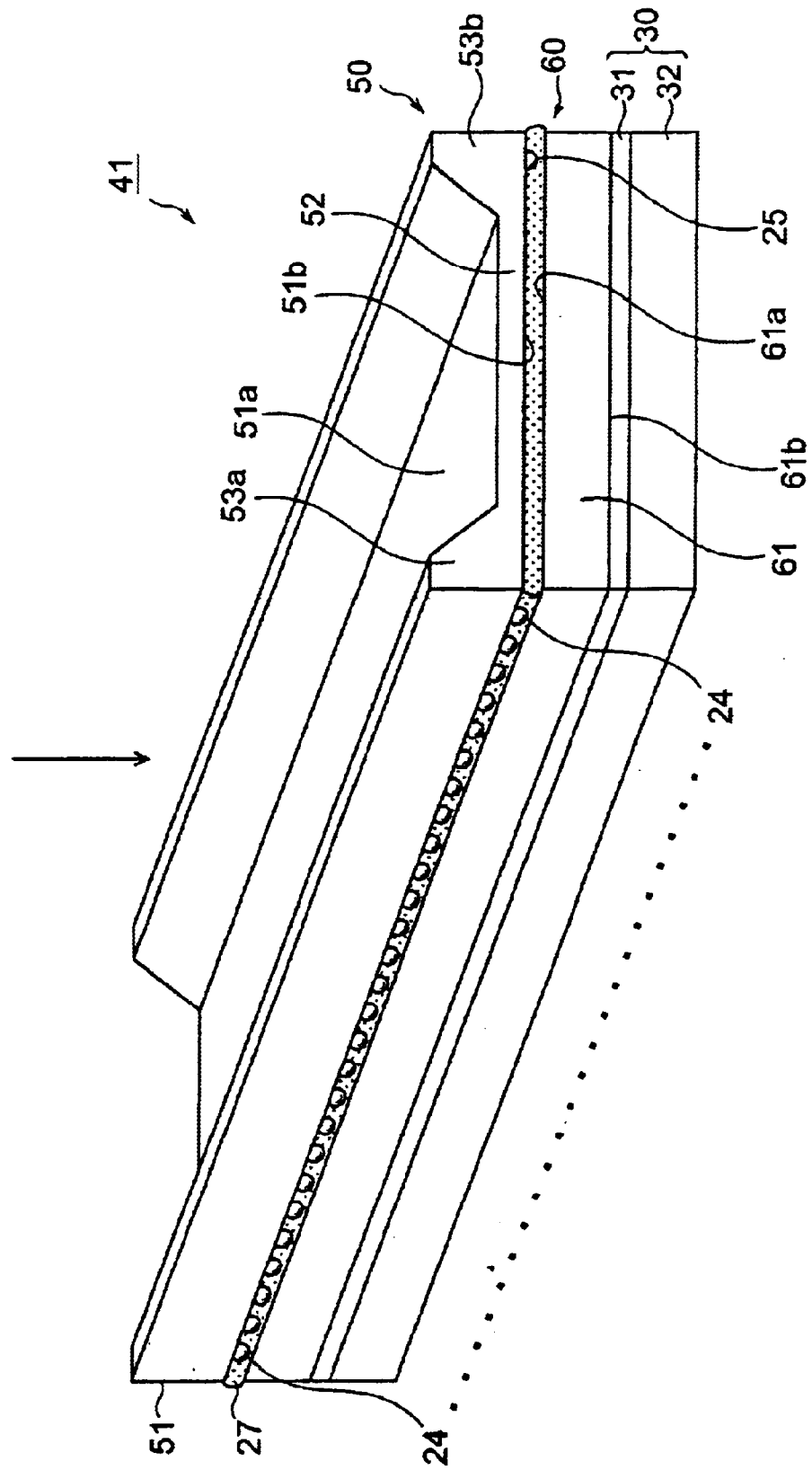
FIG. 7 is a diagram depicting a perspective outer appearance view of a second embodiment of the semiconductor device in accordance with the instant invention.
Figure 8:
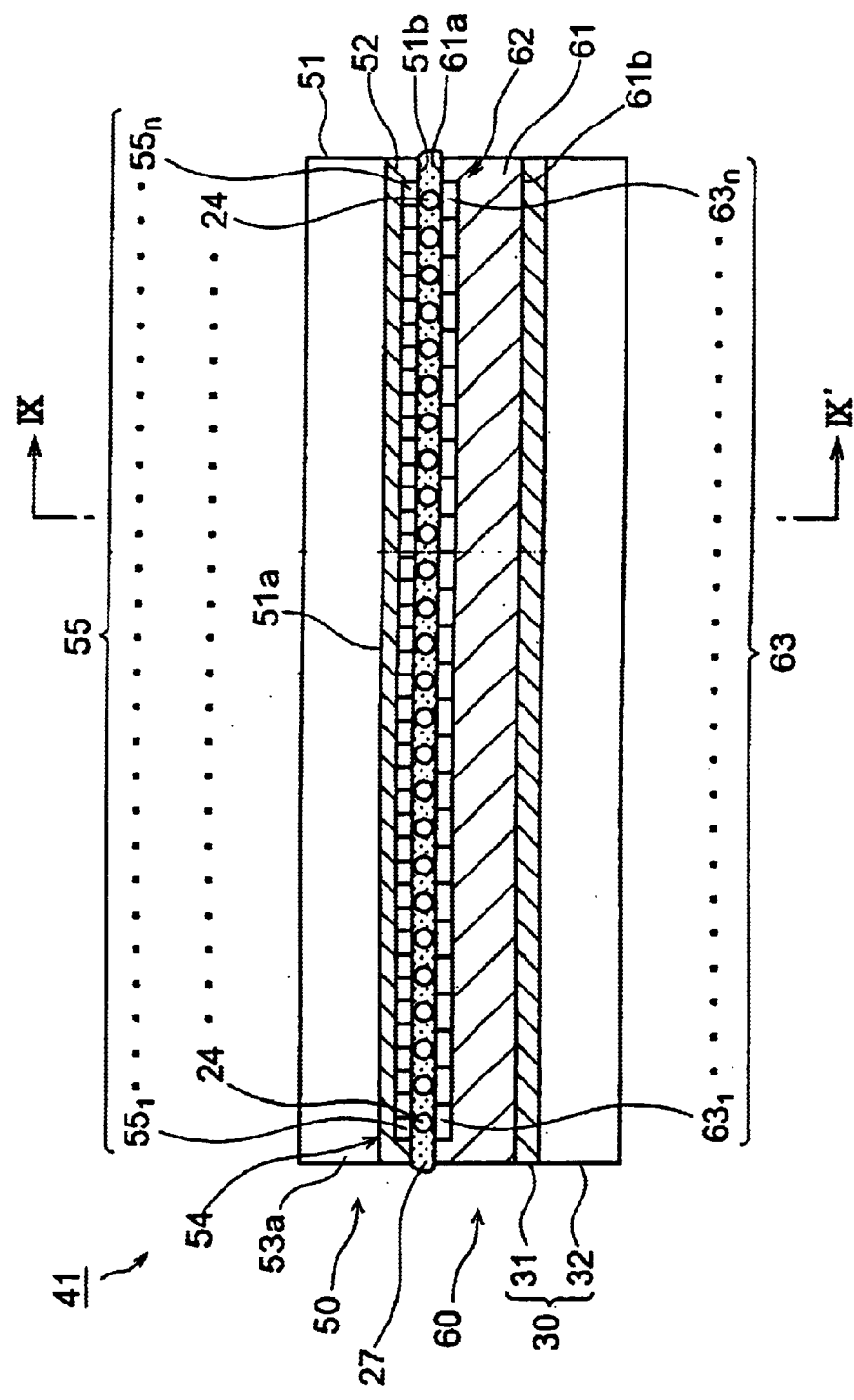
FIG. 8 is a sectional view along the longitudinal direction of the semiconductor device, for showing the second embodiment of the semiconductor device in accordance with this invention.
Figure 9:
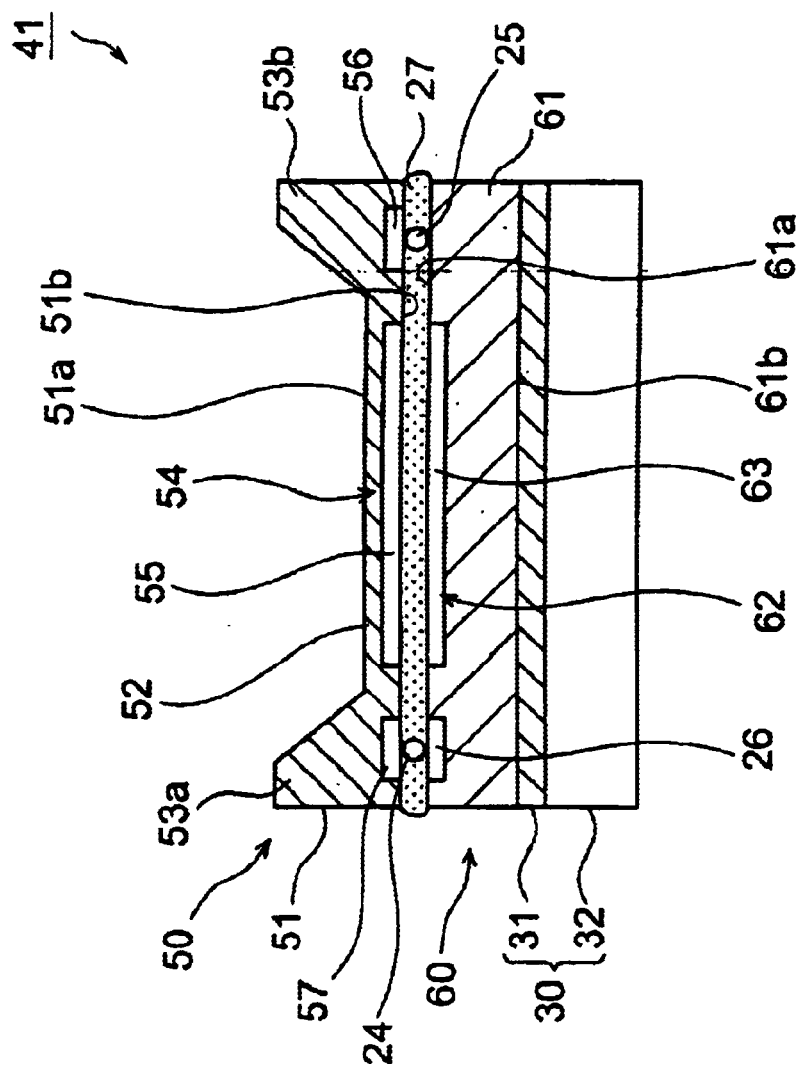
FIG. 9 is a sectional view taken along line IX–IX' of FIG. 8.
Figure 10:
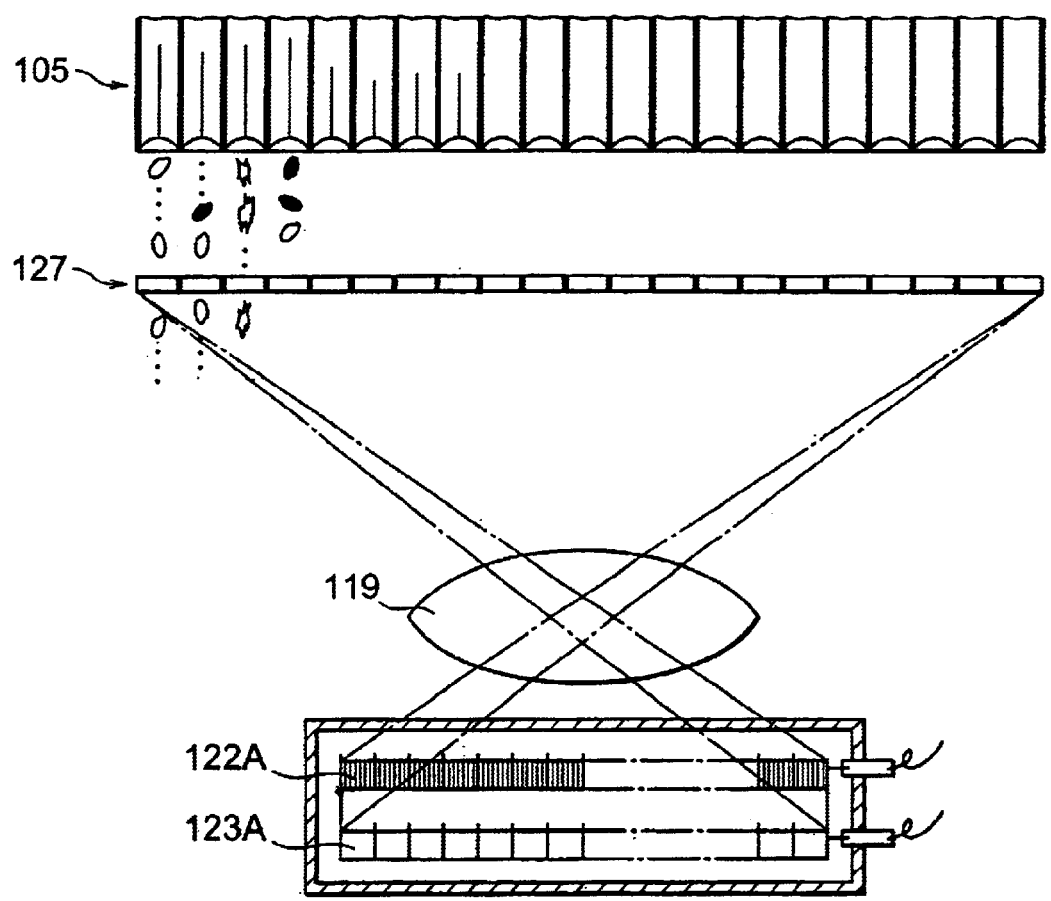
FIG. 10 is a diagram showing one prior art device.

FIG. 7 is a diagram showing a perspective view of outer appearance of a semiconductor device in accordance with a second embodiment of the invention; FIG. 8 is a diagram showing a longitudinal sectional view of the semiconductor device as cut along a longer direction of the semiconductor device; and, FIG. 9 is a diagram showing a sectional view of the semiconductor device as cut along line IX–IX' of FIG. 8. In the second embodiment, an example is shown wherein the semiconductor device is applied to a contaminant detection device based on absorption of a specified wavelength band.

The semiconductor device, generally denoted by numeral 41, is mainly constituted from a first photodetector 50, second photodetector 60, and cooler 30. The semiconductor device 41 is provided and disposed so that light is irradiated by an illumination means (not shown) onto contaminants causing light from illuminated grain particles to enter (incident from an arrow direction in FIG. 7) the first photodetector 50 side from a single optical system (not shown).

As in the first embodiment, the first photodetector 50 has a first substrate 51 of almost rectangular shape when seen in plan view, wherein this first substrate 51 is formed of a P-type Si substrate. A thin shape section 52 extending in the plan-viewed long axis direction is formed in the first substrate 51 at a central position of the first substrate 51 in the plan-viewed long axis direction thereof. The thin shape section 52 is designed to measure approximately 10 to 30 µm in thickness. Edge portions 53a, 53b that are placed on the both sides of the thin shape section 52 are about 300 µm thickness in order to attain the intended mechanical strength of the first substrate 51. A back surface 51b of the first substrate 51 with respect to a first incidence plane 51a is formed into almost planar shape.

A CCD unit 54 is formed on the back surface 51b side with respect to the first incidence plane 51a of thin shape section 52: in this CCD unit 54, first cells (pixels) $55_{1-n}$ constituting a first charge read section are disposed at part spanning from a one-edge nearby position to another-edge nearby location in the plan-viewed long axis direction of the first substrate 51 to have an array-like shape in a direction (plan-viewed long axis direction of the first substrate 51) along which the thin shape section 52 extends; for example, at 24 µm pitches in 256 columns. Also provided in the CCD unit 54 are a first shift register 56 for use as a first charge transfer section and a second shift register 57 serving as second charge transfer section with the first cells (pixels) $55_{1-n}$ being laid therebetween. The first shift register 56 is designed to sequentially scan respective ones of the first cells (pixels) $55_{1-n}$ for transportation of a packet of charge carriers as read out of the first cells (pixels) $55_{1-n}$ to thereby output position information of respective first cells (pixels) 55 from an electrode section (not shown) as a time sequence signal.

The second photodetector 60 has a second substrate 61 which is formed to have an almost rectangular solid body shape, wherein a length of the second substrate 61 in the plan-viewed long axis direction is designed to be substantially equal to the length of first substrate 51 in the plan-viewed long axis direction. An InGaAs photodiode unit 62 is formed on the second incidence plane 61a side of the second substrate 61: in this InGaAs photodiode unit 62, second cells (pixels) $63_{1-n}$ that constitute a second photoelectric conversion section and second charge read section are provided and disposed into an array shape in the plan-viewed long axis direction of second substrate 61 in such a manner as to be almost identical to a layout length of the first cells (pixels) 55 in the plan-viewed long axis direction of first substrate 51. InGaAs (second semiconductor) constituting the second photoelectric conversion section has its absorption characteristics (sensitivity) of 0.7 to 1.7 µm in the same manner as the first embodiment, wherein this range is offset toward the long wavelength side when compared to the 0.12–1.1 µm absorption characteristics (sensitivity) range of Si (first semiconductor).

As shown in FIG. 8 the first substrate 51 and second substrate 61 are stacked over each other in such a manner that the back surface 51b of first substrate 51 (thin shape section 52) opposes the second incidence plane 61a of second substrate 61 to ensure that the first photoelectric conversion region 55 of the CCD unit 54 overlaps the second photoelectric conversion region 63 of InGaAs photodiode unit 62 when seen in plan view. Provided between the first substrate 51 and second substrate 61 are bumps 24, 25 each with a height of about 50 µm while letting the back face 51b of first substrate 51 (thin shape section 52) and the second incidence plane 61a of second substrate 61 be disposed adjacent to each other in the state that a distance between the back face 51b of first substrate 51 (thin shape section 52) and the second incidence plane 61a of second substrate 61 is controlled to measure about 50 µm. Additionally the position alignment accuracy of the first substrate 51 in the plan-viewed long axis direction thereof is set at ±5 µm, or more or less.

The bumps 24 are bumps having electrical conductivity, and the second cells (pixels) $63_{1-n}$ are connected to the second shift register 57 via the bumps 24 and electrode pads 26 as electrically connected to the second cells (pixels) $63_{1-n}$. The second shift register 57 is arranged to sequentially scan respective ones of the second cells (pixels) $63_{1-n}$ for transportation of charge carriers as read out of the second cells (pixels) $63_{1-n}$ to thereby output positional information of respective second cells (pixels) 63 from an electrode section (not depicted) as a time sequence signal. The bumps 25 are nonconductive bumps (dummy bumps).

A resin 27 which is optically transparent relative to the 0.7–1.7 μm wavelength range that is the absorption characteristics (sensitivity) range of InGaAs is filled and hardened between the first substrate 51 and the second substrate 61, wherein the resin 27 may be silicone resin by way of example.

The back face 61b side with respect to the surface (second incidence plane) 61a of the second substrate 61 which opposes the first substrate 51 is formed to have an almost planar shape with the cooler 30 being contacted with this back face 61b. The cooler 30 has a Peltier element 32 and a plate 31, contacted with the second substrate 61, made of Al or else that is excellent in thermal conductivity, wherein a heat absorption section of the Peltier element 32 is provided so that it is in contact with a heat exchange plate 31. A heat generation section of the Peltier element 32 which is placed on the opposite side to the hear absorption section is connected to a power supply unit (not shown) for supplying electrical power to the Peltier element 32.

According to the semiconductor device 41 arranged as described above, certain light falling onto the semiconductor device 41 which is of 0.12–1.1 μm—this range is within the absorption characteristics range of Si (first semiconductor)—is absorbed and then converted into a packet of electrical charge carriers. This charge packet that has been converted within the Si (first semiconductor) is read out of the first cells (pixels) $55_{1-n}$ at the CCD unit 54 and then transferred by the first shift register 56 thus permitting positional information of respective first cells (pixels) $55_{1-n}$ to be output from the electrode section (not shown) as a time sequence signal. And, based on such output signal from the electrode section, detection of colored grains or particles (position detection) is performed.

The incident light to the semiconductor device 41 which are on the long wavelength side greater than the 0.12–1.1 μm range that is the absorption characteristics range of Si (first semiconductor) are not absorbed and attempt to reach the InGaAs photodiode unit 62 (second cells (pixels) $63_{1-n}$). The light arrived at the InGaAs photodiode unit 62 (second cells (pixels) $63_{1-n}$) is then absorbed by InGaAs (second semiconductor) for conversion to charge carriers. The charge packet converted within the InGaAs (second semiconductor) is read out of the InGaAs photodiode unit 62 (second cells (pixels) $63_{1-n}$) and is then transferred by the second shift register 57, thereby allowing positional information of respective second cells (pixels) $63_{1-n}$ to be output from the electrode section (not shown) as a time sequence signal. And, based on such output signal from the electrode section, plastic fragments and glass pieces plus white stones (position detection) is detected.

In the second embodiment also, it offers similar operations and effects to those of the first embodiment stated previously; more specifically, because the thin shape section 52 is formed in the first substrate 51 (P-type Si substrate), it is possible to prevent electrons created through photoelectric conversion at part near the first incidence plane 51a from disappearing due to recombination before diffusion into potential wells as formed by respective first cells (pixels) $55_{1-n}$ while at the same time shortening the distance between the first incidence plane 51a of thin shape section 52 used for photoelectric conversion and respective first cells (pixels) $55_{1-n}$ to thereby reduce diffusion toward neighboring cells thus preventing reduction of the resolution. Additionally, since the thin shape section 52 is formed in the first substrate 51 (P-type Si substrate) while providing the second cells (pixels) $63_{1n}$ opposing this thin shape section 52, the light of near infrared range of 0.7–1.1 μm is no longer partly absorbed by Si and thus reaches the second cells (pixels) $63_{1-n}$. Whereby, it becomes possible to detect the light with wavelength range of 0.7–1.1 μm at the second cells (pixels) $63_{1-n}$.

In addition, since the thin shape section 52 is formed while simultaneously causing the first substrate 51 and the second substrate 61 to be stacked over each other with the back surface 51b of the first substrate 51 (thin shape section 52) and the second incidence plane 61a of second substrate 61 adjacently opposing each other when seen in plan view, it is possible to permit any incident light onto the semiconductor device 41 to be substantially focussed even with respect to either one of the thin shape section 52 and the second photoelectric conversion region 63, which in turn makes it possible to suppress reduction of the sensitivities at the first photodetector 50 and second photodetector 60. Additionally, as the thin shape section 52 and the second photoelectric conversion region 63 are in the state that they are adjacent to each other, reduction of the sensitivity at either the first photodetector 50 or the second photodetector 60 occurring due to deviation may also be suppressed.

In addition, since the dielectric resin material 27 such as for example silicone resin which is optically transparent relative to the wavelength of 0.7 to 1.7 μm that is the absorption characteristics (sensitivity) range of InGaAs is filled and hardened between the first substrate 51 and the second substrate 61, the first substrate 51 and second substrate 61 are connected by the resin 27, thus making it possible to increase the mechanical strength of the thin shape section 52 of first substrate 51 in particular. Additionally, as the resin 27 is optically transparent relative to the 0.7–1.7 μm wavelength range which is the absorption characteristics (sensitivity) range of InGaAs, it is possible to suppress or preclude it from affecting the sensitivity at the second photodetector 60 (InGaAs photodiode unit 62).

In addition, as the first shift register 56 and second shift register 57 are provided in the CCD unit 54 of the first substrate 51, it is no longer necessary to provide any shift registers in the second substrate 61, which makes it possible to miniaturize or "downsize" the semiconductor device 41.

In addition, since the first shift register 56 and the second shift register 57 are provided with the first photoelectric conversion region laid therebetween while letting the second cells (pixels) 63 be connected to the second shift register 57 via the bumps 24 and electrode pads 26 as electrically connected to the second cells (pixels) $63_{1n}$, it is not necessary to provide any shift registers on the second substrate 61, thereby enabling miniaturization or downsizing of the semiconductor device 41. Additionally, since the first substrate 51 and the second substrate 61 are connected (bump-bonded) together with the bumps 24, 25 intervening therebetween, it is possible to reliably control a distance between the back surface 51b of first substrate 51 (thin shape section 52) and the second incidence plane 61a of second substrate 61 (about 50 μm in this embodiment) while also making it possible to suppress creation of deviation in the sensitivities of the first photodetector 50 and second photodetector 60 due to a change in distance between the back surface 51b of first substrate 51 (thin shape section 52) and the second incidence plane 61a of second substrate 61.

In addition, as the back surface 61b side with respect to the surface (second incidence plane) 61a of the second substrate 61 which opposes the first substrate 51 is formed to have an almost planar shape with the cooler 30 being attached to and contacted with this back surface 61b, it becomes possible to improve the cooling efficiency of the second substrate 61. Owing to the cooling of the second substrate 61 by the cooler 30, it is possible to suppress generation of dark currents at the InGaAs photodiode unit 62 (second cells (pixels) $63_{1-n}$) especially in the case of usage in room temperature conditions. Since the second cells (pixels) $63_{1-n}$ are connected to the second shift register 57 via the bumps 24 and electrode pads 26 as electrically connected to the second cells (pixels) 63, it is possible to form the back surface 61b of the second substrate 61 into almost planar shape without suffering from any limitations from the others.

In addition, since the first substrate 51 and second substrate 61 are made integral together, execution of optical axis adjustment of the first cells (pixels) $55_{1-n}$ of the CCD unit 54 with respect to an optical system (not shown) used for introduction of light onto the semiconductor device 41 results in effectuation of light axis adjustment of the second cells (pixels) 63 of InGaAs photodiode unit 62 also, which makes it possible to omit optical axis adjustment works of the second photoelectric conversion region 63 of InGaAs photodiode unit 62, thus enabling simplification of the optical axis adjustment works at the semiconductor device 41.

Although in the first embodiment the semiconductor device 1 is applied to measurement apparatus (spectrum analyzer equipment) for measuring an intensity distribution as a function of the wavelength in a specified direction whereas the second embodiment is such that the semiconductor device 41 is applied to the contaminant detection device based on absorption of specified wavelength band, it should not be limited thereto and can also be applied to light (energy ray) detection devices. It is also possible to provide a plurality of optical systems for introduction of light onto the semiconductor devices 1, 41.

In addition, although in the first embodiment and second embodiment two shift registers of the first shift register 16, 56 and second shift register 17, 57 are provided therein, these embodiments may be arranged so that a single shift register is provided for time-sequential readout with the first cells $15_{1-n}, 55_{1-n}$ side and second cells $23_{1-n}, 63_{1-n}$ side being shifted along a time axis or alternatively for simultaneous readout. Additionally, although the second cells $23_{1-n}, 63_{1-n}$ are connected to the second shift register 17, 57 via the bumps 24 having electrical conductivity, they may alternatively be designed to be connected by wire bonding or the like. Optionally the first shift register 16, 56 and second shift register 17, 57 may be designed so that these are provided on the second substrate 21, 61.

Although Si is employed as the semiconductor used for photoelectric conversion of incident light in the first photodetector whereas InGaAs is used in the second photodetector, it should not be limited thereto and other semiconductors (compound semiconductors) may be used. For example, in place of InGaAs, Ge having absorption (sensitivity) characteristics range of 0.8 to 1.8 $\mu$m or InAs (77K) having absorption (sensitivity) characteristics range of 1 to 3.1 m or InSb (77K) having absorption (sensitivity) characteristics range of 1 to 5.5 $\mu$m or else may be applied. Additionally, it is also possible to arrange that more than three photodetectors are stacked or laminated over one another, wherein a third photodetector having its absorption (sensitivity) characteristics range shifted toward the long wavelength side beyond the wavelength ranges of the absorption (sensitivity) characteristics that the first photodetector and second photodetector have may be disposed to overlap on the back face side with respect to the surface of the second photodetector which opposes the first photodetector. In this case, it is also possible to employ Si at the first photodetector and InAs at the second photodetector while using HgCdTe (77K) having its absorption (sensitivity) characteristics range of 2 to 16 $\mu$m at the third photodetector, by way of example.

As has been explained above, the aforementioned semiconductor device is the semiconductor device which comprises a first photodetector having a first photoelectric conversion section made of a first semiconductor in which electrical charge carriers are produced due to introduction of an energy ray with a first wavelength range from a first incidence plane and a first charge read section for reading the charge carriers produced at the first photoelectric conversion section, and a second photodetector having a second photoelectric conversion section made of a second semiconductor in which charge carriers are produced due to introduction of an energy ray with a second wavelength range on the long wavelength side beyond the first wavelength range from a second incidence plane and a second charge read section for reading the charges produced at the second photoelectric conversion section, characterized in that the first photodetector has a first substrate with a plurality of first charge read portions being disposed on the back surface side with respect to the first incidence plane in a specified direction and with certain part corresponding to the first charge read portions of the first photoelectric conversion section being formed into a thin shape form, that the second photodetector has a second substrate with a plurality of second charge read portions being laid out on the second incidence plane side in a specified direction, and that the first substrate and the second substrate are stacked or laminated over each other while letting the back face with respect to the first incidence plane of the first substrate adjacently oppose the second incidence plane of the second substrate and are disposed so that an energy ray is incident from the first incidence plane of the first substrate.

In the case of employing such arrangement, since the part corresponding to the first charge read portions of the first photoelectric conversion section is formed to have a thin shape form while letting the first substrate of the first photodetector and the second substrate of the second photodetector be stacked in such a manner that the back face of the first substrate with respect to the first incidence plane and the second incidence plane of the second substrate adjacently oppose or overlap each other and also allowing an energy ray to enter from the first incidence plane of the first substrate, the first photoelectric conversion section and the second photoelectric conversion section are in the state that these are adjacent to each other. Accordingly, with employment of the above-stated arrangement, even in the case of employing a single optical system, setting the focusing position of such optical system at a substantially intermediate or "midway" position between the back face of the first substrate with respect to the first incidence plane and the second incidence plane of the second substrate makes it possible to substantially focus the energy ray even with respect to any one of the first photoelectric conversion section and the second photoelectric conversion section, thereby enabling suppression of reduction in sensitivities at the first photodetector and second photodetector. Additionally, since the first photoelectric conversion section and the second photoelectric conversion section are in the state that they are in close proximity to each other even where the optical system's focusing position is deviated from the almost intermediate position between the back face of the first substrate with respect to the first incidence plane and the second incidence plane of the second substrate, reduction of sensitivity due to the above-noted deviation will be suppressed at the first photodetector or at the second photodetector.

In addition, it is preferable that a resin which is optically transparent relative to the second wavelength range be filled between the back face of the first substrate with respect to the first incidence plane and the second incidence plane of the second substrate. In case this arrangement is employed, the first substrate and the second substrate are coupled together by the resin, which especially makes it possible to increase the mechanical strength of part of the first photoelectric conversion section (first substrate) which is formed into the thin shape form. Additionally, as the resin is optically transparent relative to the second wavelength range, it is possible to suppress undesired influence upon the sensitivity at the second photodetector. Here, the term "optically transparent" as used herein is to be understood to mean the state that the uniformity in quality is high and the permeability or transparency is extremely high without risks of occurrence of any substantial absorption and dispersion at a wavelength range used.

It will also be preferable that the first charge readout section and the second charge readout section be provided so that at least partial regions thereof are stacked over each other in a specified direction when looking at from the energy ray incident direction. In the case of employing such arrangement, miniaturization or downsizing of the semiconductor device becomes possible. Additionally, since a specific photoelectric conversion section of the charge readout sections as disposed in the specified direction which corresponds to the charge readout section being placed at the edge portion becomes greater in dark current when compared to the remaining photoelectric conversion sections, an output signal based on the charge carriers read at the charge readout section placed at the edge portion decreases in reliability; however, as the first photoelectric conversion section and the second photoelectric conversion section are provided so that they are stacked over each other when looking at from the energy ray incident direction, it is possible at this stacked part to interpolate an output signal from one photoelectric conversion section with an output signal from the other photoelectric conversion section, which in turn makes it possible to enhance the reliability of such output signal. Additionally, in case the semiconductor device is adapted for use in measurement apparatus which measures an intensity distribution as a function of the wavelength in a specified direction, it becomes possible to obtain continued intensity distribution information.

It is also preferable to have a first charge transfer section for transferring charge carriers as has been read at the first charge readout section in a predetermined direction and a second charge transfer section for transferring charges as read at the second charge readout section in a predetermined direction. In the case of employing this arrangement, in the event that an output signal from one photoelectric conversion section is interpolated with an output signal from the other photoelectric conversion section at the mutually stacked portions of the first charge readout section and the second charge readout section when seen from the energy ray incident direction, a packet of charge carriers read at the first or second charge readout section is independently transferred at the first or second charge transfer section for obtainment of output signals from the first and second charge transfer sections in a parallel way; thus, it becomes possible to achieve rapid interpolation with a simplified arrangement.

It is also preferable that the first charge transfer section and the second charge transfer section are provided at either one of the first substrate or the second substrate. In the case of employing such arrangement, it is no longer necessary to provide any charge transfer sections at either remaining one of the first substrate or the second substrate, which makes it possible to make smaller an overall size of the semiconductor device.

It is also preferable that the first charge transfer section and the second charge transfer section are provided at the first substrate while letting the second charge readout section and the second charge transfer section be connected by bump bonding to ensure that charge carriers read at the second charge readout section are sent forth toward the second charge transfer section. In the case of employing this arrangement, it is no longer necessary to provide any charge transfer sections at the second substrate, which makes it possible to miniaturize the semiconductor device. Additionally, since the second charge readout section and the second charge transfer section are connected by bump bonding, it is possible to reliably control the distance between the back face of the first substrate with respect to the first incidence plane and the second incidence plane of the second substrate, which makes it possible to suppress creation of deviation in the sensitivities of the first photodetector and second photodetector due to a change in distance between the back face of the first substrate with respect to the first incidence plane and the second incidence plane of the second substrate.

It is also preferable that the back face of the second substrate with respect to the second incidence plane be formed to have an almost planar shape while causing a cooler for cooling down the second substrate to be provided in the state that it is in contact with the back face of the second substrate. In the case of employing such arrangement, it becomes possible to improve the cooling efficiency of the second substrate. Since the charge packet as created at the second photoelectric conversion section is sent to the second charge transfer section which is provided at the first substrate via bump bonding, it is possible to form the back face of the second substrate into the almost planar shape without receiving any limitations from the others.

It is also preferable that the length of the second substrate in a specified direction be set shorter than the length of first substrate in the specified direction with a third substrate being provided on the lateral side of the second substrate in such a manner that the third substrate is provided to adjacently oppose the back face of the first substrate with respect to the first incidence plane and have its thermal conductivity equal to that of the second substrate with the cooler being provided in the state that it is also connected with the third substrate. In the case of employing this arrangement, as the length of the second substrate in the specified direction is set to be shorter than the length of first substrate in the specified direction, it is possible to attain reduction of production costs. Additionally, in case the length of the second substrate in the specified direction is set shorter than the length of first substrate in the specified direction, since a portion to which heat to the cooler is transmitted through the second substrate and a portion to which no heat is transmitted (second substrate does not exists) are present at the first substrate, temperatures within the first substrate becomes irregular or non-uniform leading to the possibility of badly affecting the detection accuracies at the first photoelectric conversion section and the first charge readout section and the transfer rate at the charge transfer section(s). According to the arrangement stated supra, since the third substrate which is substantially equal in thermal conductivity to the second substrate intervenes between the cooler and the first substrate, it is possible to permit the temperatures within the first substrate to become substantially uniform irrespective of the fact that the portion to which heat to the cooler is transmitted via the second substrate and the portion to which heat to the cooler is transmitted via the third substrate exist at the first substrate, thereby enabling suppression or prevention of unwanted influence upon the detection accuracies at the first photoelectric conversion section and the first charge readout section and the transfer rate at the charge transfer sections.

As has been described in detail above, according to the present invention, it is possible to provide a semiconductor device capable of suppressing reduction of the sensitivity at each photodetector with respect to a plurality of photodetectors that are disposed so that they are stacked or laminated over each other even in the case of employing a single optical system with respect to such plurality of photodetectors. Optionally any one of materials selected from the group consisting of InAs, InSb, HgCdTe, PbS, PbSe and HgCdTe as compound semiconductors other than InGaAs is useable as the above-noted second semiconductor; alternatively, intrinsic Ge or Ge doped with at least any one of the materials selected from the group consisting of Au, Hg, Cu, Zn, Ga and As may also be used.

What is claimed is:

1. A semiconductor device comprising:

a first back-illuminated semiconductor image pickup element, having a front and a back and a first photosensitive region which is closer to said front than said back thereof; and a second semiconductor image pickup element also having a front and a back and a second photosensitive region which is closer to said front than back thereof, said second semiconductor image pickup element being made of a semiconductor material different from that of said first back-illuminated semiconductor image pickup element, wherein said first back-illuminated semiconductor image pickup element and said second semiconductor image pickup element are secured such that respective fronts of said first back-illuminated semiconductor image pickup element and said second semiconductor image pickup element are closer to each other than their respective backs;

wherein mutually opposite faces of said first back-illuminated semiconductor image pickup element and said second semiconductor image pickup element are adhered via at least three or more bumps;

wherein said first back-illuminated semiconductor image pickup element comprises a shift register as formed over said first back-illuminated semiconductor image pickup element;

wherein said shift register is electrically connected via said bumps to said second semiconductor image pickup element, and that a signal from said second semiconductor image pickup element is read by driving said shift register; and wherein said first back-illuminated semiconductor image pickup element is made of a wider energy band gap material than that of said second semiconductor image pickup element, the wider energy band gap material forming a thin shape portion for receiving light.

2. The semiconductor device as recited in claim 1, characterized in that mutually opposite faces of said first back-illuminated semiconductor image pickup element and said second semiconductor image pickup element are adhered via a resin.

3. The semiconductor device as recited in claim 1, characterized in that said first back-illuminated semiconductor image pickup element contains Si.

4. The semiconductor device as recited in claim 3, characterized in that said second semiconductor image pickup element contains a compound semiconductor.

5. The semiconductor device as recited in claim 4, characterized in that said compound semiconductor includes InGaAs.

6. The semiconductor device as recited in claim 1, characterized in that a cooler is in contact with a face of the second semiconductor image pickup element on the opposite side to said first back-illuminated semiconductor image pickup element.

7. The semiconductor device as recited in claim 6, characterized in that:

said first back-illuminated semiconductor image pickup element and said second semiconductor image pickup element partly overlap; and a substrate containing the same material as said second semiconductor image pickup element is contacted with a region at of said first back-illuminated semiconductor image pickup element, wherein this region does not overlap said second semiconductor image pickup element.

* * * * *